(12) United States Patent
Tsai et al.

(10) Patent No.: US 6,710,512 B2
(45) Date of Patent: Mar. 23, 2004

(54) MICROELEMENT PIEZOELECTRIC FEEDBACK TYPE PICKING AND RELEASING DEVICE

(75) Inventors: Hung-Yin Tsai, Hsinchu Hsien (TW); Chih-Yung Cheng, Tai Tung (TW); Ping-Yin Liu, Yung Ho (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 10/175,841

(22) Filed: Jun. 21, 2002

(65) Prior Publication Data

US 2003/0234594 A1 Dec. 25, 2003

(51) Int. Cl.[7] .................................................. H01I 41/08
(52) U.S. Cl. .................................................. 310/313 R
(58) Field of Search ........................... 310/328, 323.17, 310/323.18, 366, 313 B, 313 C; 333/154

(56) References Cited

U.S. PATENT DOCUMENTS 3,766,496 A * 10/1973 Whitehouse ............ 331/107 A
4,701,657 A * 10/1987 Grassl ..................... 310/313 C
5,025,346 A * 6/1991 Tang et al. ............... 361/283.1
5,455,547 A * 10/1995 Lin et al. ..................... 333/186
5,491,604 A * 2/1996 Nguyen et al. ............. 361/278
5,537,083 A * 7/1996 Lin et al. ..................... 333/186
6,236,281 B1 * 5/2001 Nguyen et al. ............. 331/154

* cited by examiner

Primary Examiner—Burton S. Mullins
Assistant Examiner—Karen Beth Addison
(74) Attorney, Agent, or Firm—Rabin & Berdo, P.C.

(57) ABSTRACT

A microelement piezoelectric feedback type picking and releasing device is constructed to include a piezoelectric material, an IDT (interdigital transducer) electrode plated and a progressive electrode plated on the piezoelectric material, the progressive electrode having a plurality of electrode elements of different sizes arranged in proper order in one direction, the IDT electrode forming a releasing unit by means of surface acoustic wave/ultrasonic wave and serving as a voltage signal feedback sensor for clamping force control.

5 Claims, 6 Drawing Sheets

MICROELEMENT PIEZOELECTRIC FEEDBACK TYPE PICKING AND RELEASING DEVICE

BACKGROUND OF THE INVENTION

1. Field of the Invention

The present invention relates to a microelement picking and releasing device for use to pick up/release micrometer/nanometer elements and, more specifically, to a microelement piezoelectric feedback type picking arrangement, which uses a progressive electrode to achieve uniform and precise deformation, piezoelectric feedback to control clamping force, and an IDT (interdigital transducer) to produce surface acoustic wave and to achieve accurate releasing.

2. Description of the Prior Art

When micrometer/nanometer electronic elements have become more and more popularly used in an electronic device, it is important to control the operation of picking and releasing micrometer/nanometer elements. When the size of micrometer elements below 0.01 mm, the physical interactions between micrometer/nanometer elements, such as surface tension, van der Waal force, surface hydrogen bond reactive force, etc., become important factors in micro/nanometer operation. Various picking-releasing measures have been disclosed. However, the known picking-releasing measures have their limitations because they are not free from the affection of element dimensional factor. The sizes of elements affect picking and releasing operations. The physical interactions between pickup (picking-releasing apparatus) and element make the releasing action difficult. During a releasing operation, it may need to apply an external energy to the pickup, or to control the oscillation of the whole pickup. However, it may damage the element when applying an external energy to the pickup or controlling the oscillation of the pickup. Further, when operating a microelement pickup (picking-releasing apparatus), it is difficult to control the clamping force. In order to control the clamping force, sensor means may be provided for detecting the applied force. However, the installation of such sensor means greatly complicates the circuit design of the pickup and also greatly increases the manufacturing cost.

With respect to operational force, it can be a contact force or non-contact force. A contact force is achieved by means of surface tension, static electricity, or magnetic force. When a non-contract force is used, it needs to apply an added energy during releasing. For example, it needs to heat water drop to the boiling point in order to eliminate surface tension. However, the added energy may damage the micrometer/nanometer element, or cause instability of the system. Furthermore, it is difficult to control the direction of the element when a non-contact force operation method is used. When a contact force method is adopted, the design of driving is commonly achieved by means of a piezoelectric material. By means of controlling electric field to control the amount of deformation of piezoelectric material, the operation of the pickup is controlled. Conventional piezoelectric pickups commonly have a single electrode with a complicated design. These conventional designs have application and precision limitations. When applying added energy or oscillating the pickup during releasing operation, the element may be damaged or not accurately positioned.

SUMMARY OF THE INVENTION

The present invention has been accomplished under the circumstances in view. It is one object of the present invention to provide a microelement piezoelectric feedback type picking and releasing device, which eliminates the drawbacks of the aforesaid prior art designs. A progressive piezoelectric electrode is provided having the electrode area gradually reducing from the fixed end toward the free end. By means of controlling the applied voltage, the progressive piezoelectric electrode causes the pickup to achieve precise deformation and a big amount of displacement. An interdigital transducer is provided near the front end of the pickup to detect the voltage change upon contact of the pick up with the microelement, and to feed back the detected signal for accurate clamping force control. Further, controlling electric current to the interdigital transducer (IDT) to produce surface acoustic wave enables the pickup to conquer the surface physical reactive force of the microelement, enabling the microelement to be released to the assigned position accurately. According to the preferred embodiment of the present invention, the microelement piezoelectric feedback type picking and releasing device comprises a piezoelectric material, an IDT (interdigital transducer) plated and a progressive electrode plated on the piezoelectric material, the progressive electrode having a plurality of electrode elements of different sizes arranged in proper order in one direction, the IDT forming a releasing unit by means of surface acoustic wave/ultrasonic wave and serving as a voltage signal feedback sensor for clamping force control.

DETAILED DESCRIPTION OF THE PREFERRED EMBODIMENT

Figure 1:
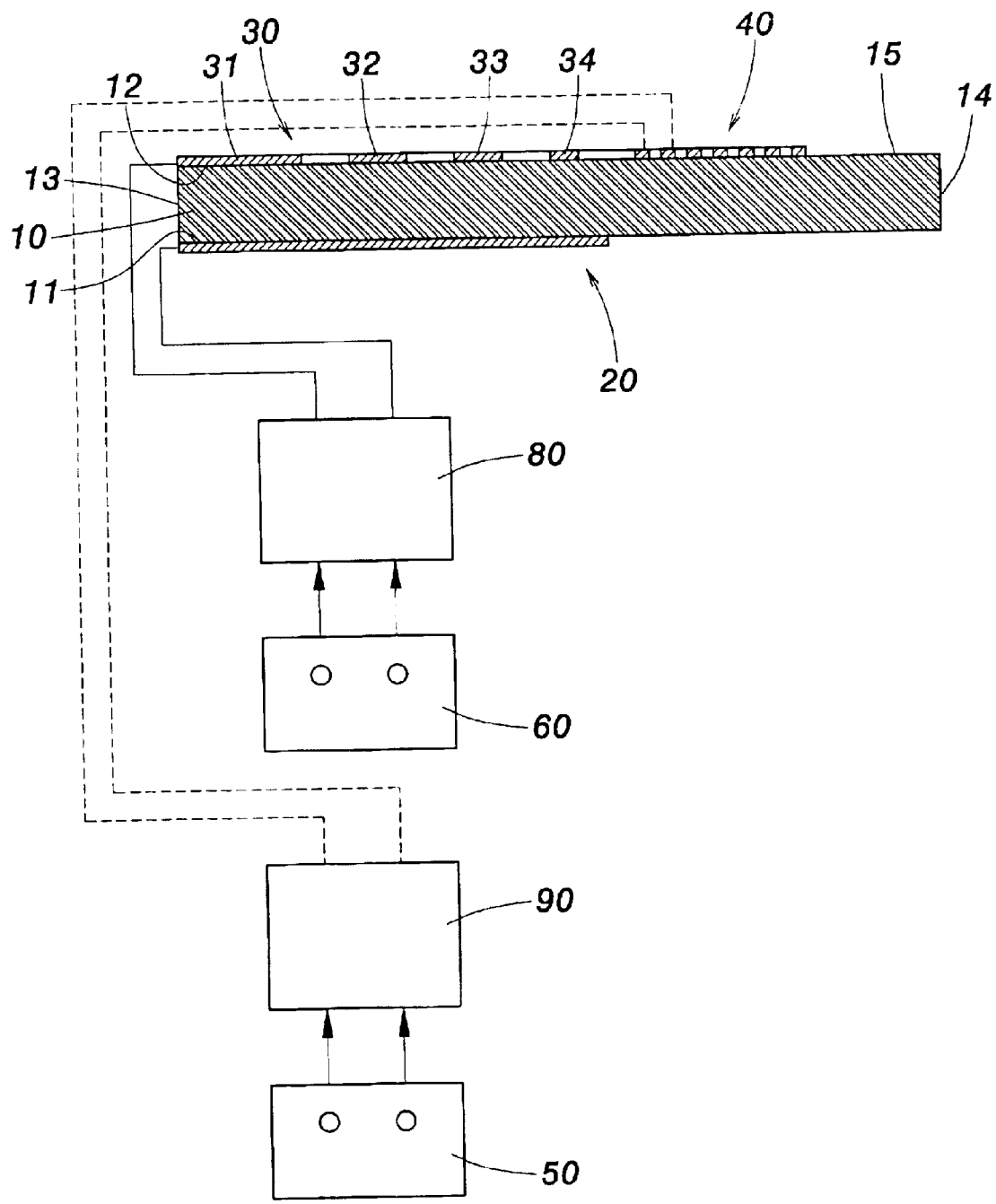
FIG. 1 is side view of a microelement piezoelectric feedback type picking and releasing device according to the present invention.
Figure 2:
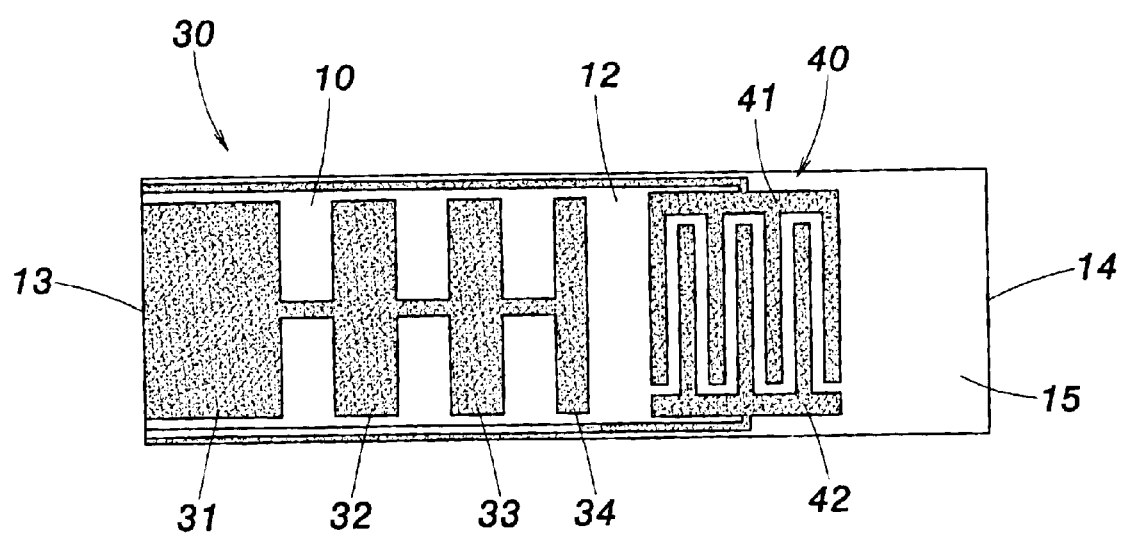
FIG. 2 is a top view of the microelement piezoelectric feedback type picking and releasing device according to the present invention.

Referring to FIGS. 1 and 2, a microelement piezoelectric feedback type picking and releasing device in accordance with the present invention is shown comprised of a piezoelectric material 10, and electrode 20, progressive electrode 30 and IDT electrode 40 provided at the piezoelectric material 10. The piezoelectric material 10 has a bottom surface 11, a top surface 12, a fixed end 13, and a free end 14. The electrodes 20, the progressive electrode 30 and IDT electrode 40 are made of metal material (for example, aluminum), having connected thereto an AC power supply 50, a DC power supply 60, a picking controller 80, and a releasing controller 90. The electrode 20 is plated on the bottom surface 11 of the piezoelectric material 10. The progressive electrode 30 and the IDT electrode 40 are respectively plated on the top surface 12 of the piezoelectric material 10. The progressive electrode 30 is comprised of a plurality of electrode elements 31, 32, 33 and 34 arranged between the fixed end 13 and the free end 14. The electrode elements 31, 32, 33 and 34 have different sizes arranged in proper order with the greatest one disposed adjacent the fixed end 13 and the smallest one disposed adjacent the free end 14. The IDT electrode 40 is formed of two IDT electrode elements 41 and 42 alternatively arranged at two sides and disposed in front of the progressive electrode 30, i.e., the IDT electrode 40 is plated on the top surface 12 of the piezoelectric material 10 and spaced between the progressive electrode 30 and the free end 14 of the piezoelectric material 10. The top surface 12 of the piezoelectric material 10 comprises a contact portion 15 spaced between the IDT electrode 40 and the free end 14 and adapted for contacting the microelement to be picked up.

Figure 3A:
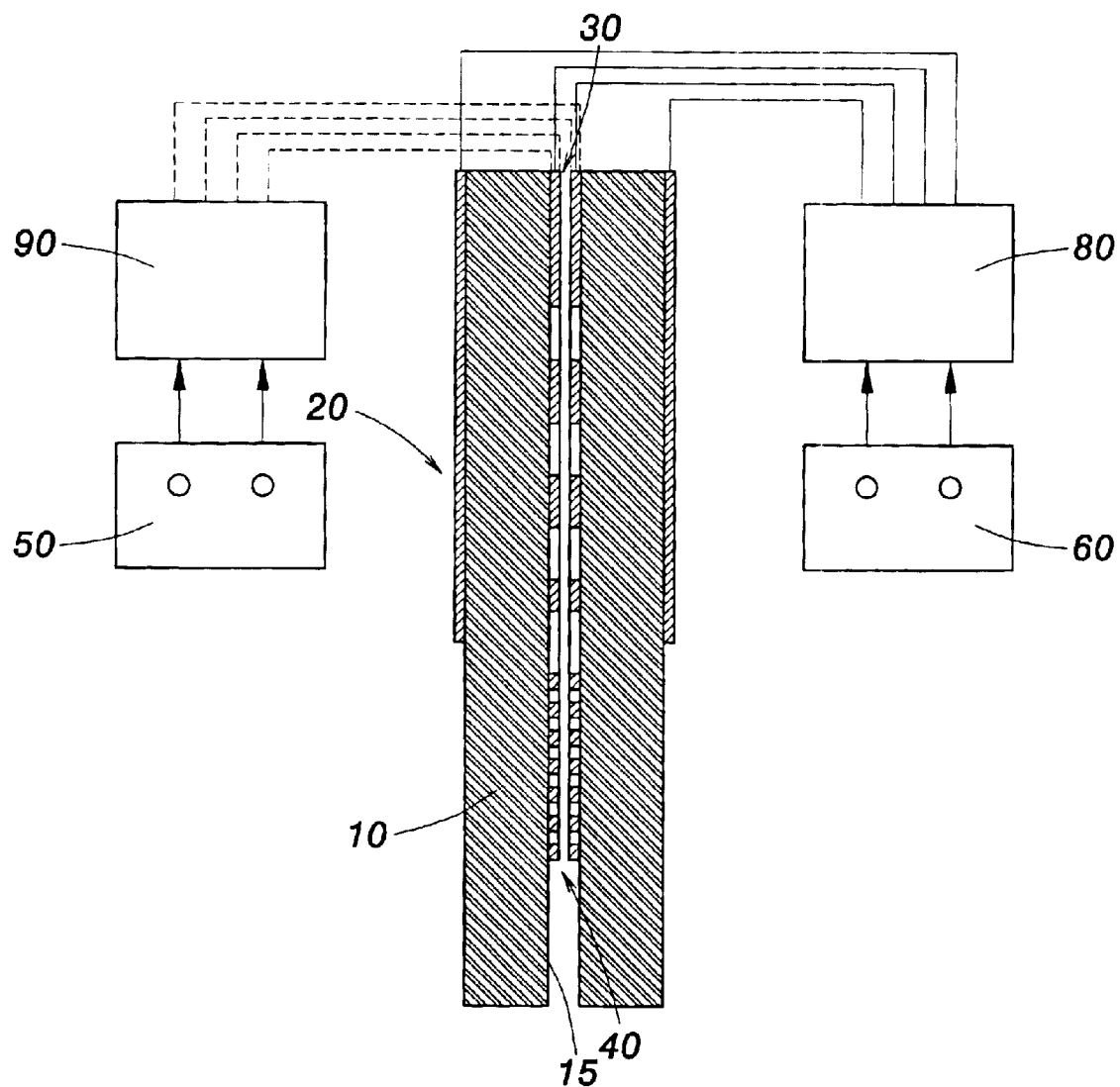
FIG. 3A is a schematic drawing showing the operation of the present invention (I).
Figure 3B:
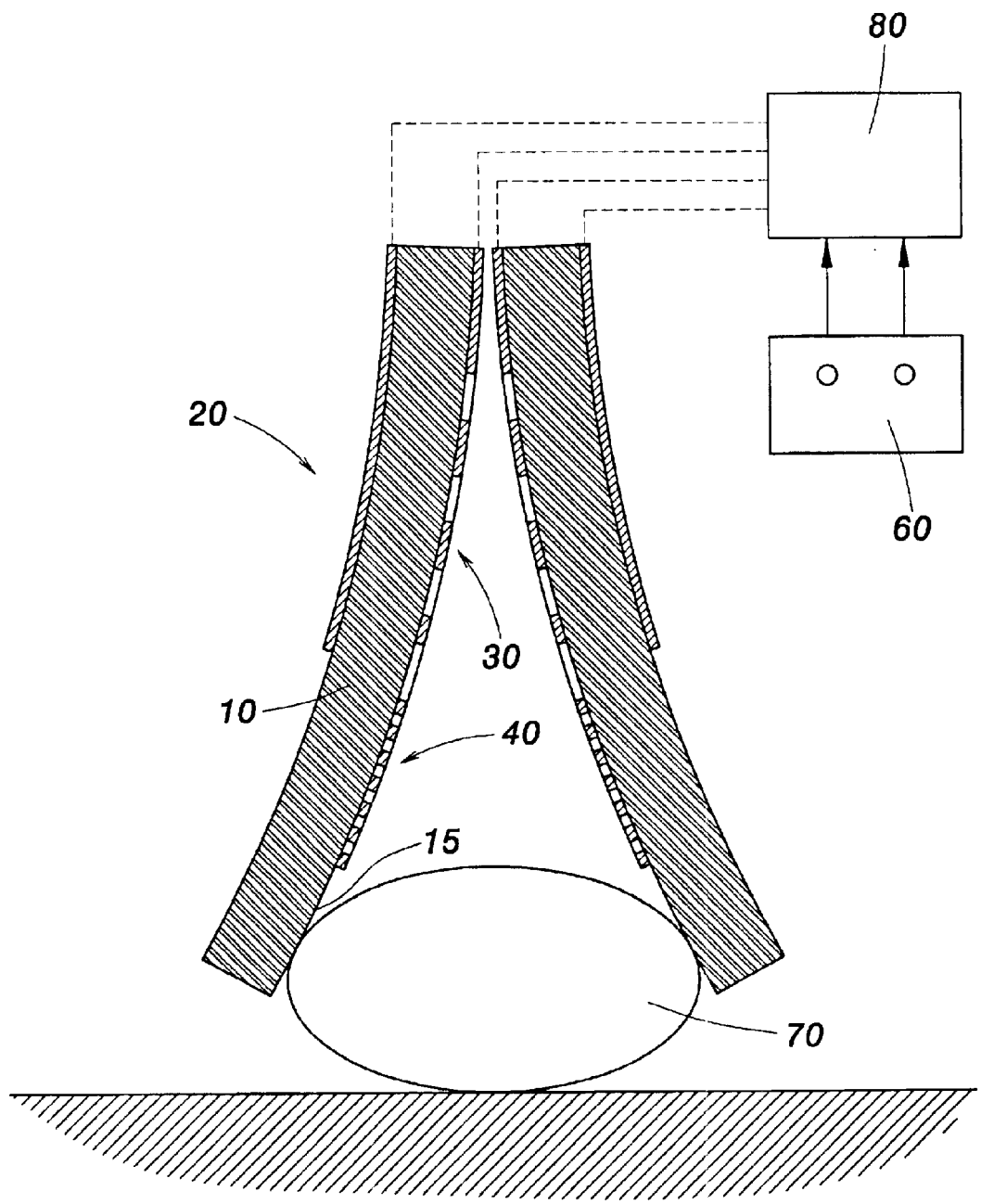
FIG. 3B is a schematic drawing showing the operation of the present invention (II).
Figure 3C:
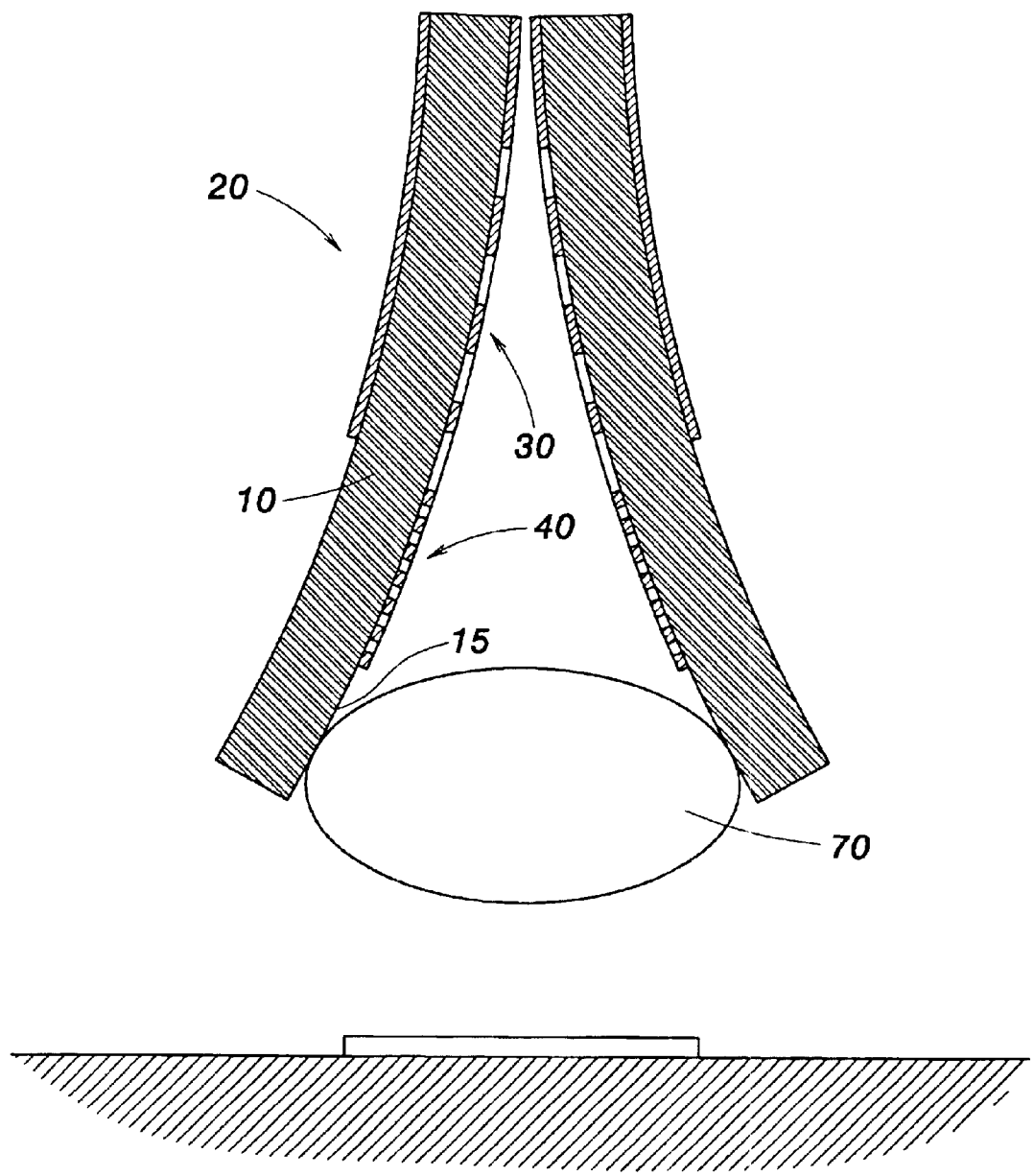
FIG. 3C is a schematic drawing showing the operation of the present invention (III).

Referring to FIGS. 3A, 3B, and 3C, when picking up a microelement 70, control the application of a voltage to the progressive electrode 30 to further control the deformation of the piezoelectric material 10 precisely, uniformly and smoothly. By means of the particular electrode design of the present invention and the control of applied voltage, the microelement pickup is deformed smoothly and controlled within the nanometer grade to precisely pick up the microelement 70 without causing damage to the microelement 70.

With respect to clamping force control, the present invention provides a feedback piezoelectric design. When the contact portion 15 contacted the microelement 70, the piezoelectric material of the contact portion 15 is deformed, causing a voltage change due to piezoelectric effect, and at the same time the IDT electrode 40 detects the variation of voltage signal and feeds the detected signal back to the releasing controller 90 for deformation amount and voltage signal analysis for reference in clamping force control. This feedback design achieves accurate control of the contact force between the microelement and the pickup, enabling the pickup to pick up the microelement stably without causing damage to the microelement.

Figure 3D:
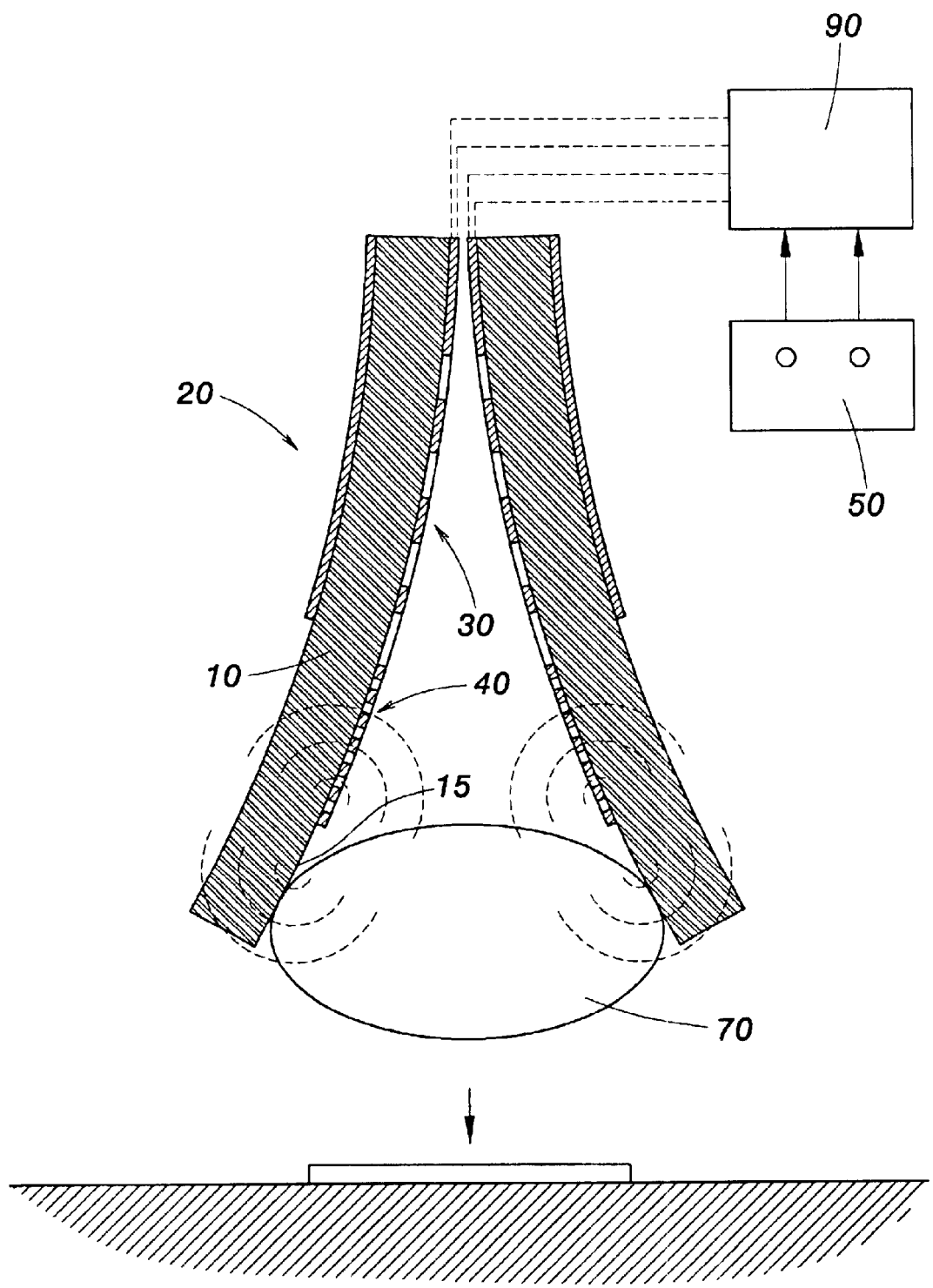
FIG. 3D is a schematic drawing showing the operation of the present invention (IV).

With respect to releasing operation, the IDT electrode 40 produces surface acoustic wave/ultrasonic wave (see FIG. 3D) when receiving no energy from the outside, forming a releasing unit. The surface acoustic wave/ultrasonic wave causes a local vibration at the surface of the piezoelectric material 10 within the contact portion 15, which vibration instantly surpasses the surface physical reactive force of the micrometer/nanometer element, enabling the element to be released to the assigned position accurately.

A prototype of microelement piezoelectric feedback type picking and releasing device has been constructed with the features of the annexed drawings of FIGS. 1~3D. The microelement piezoelectric feedback type picking and releasing device can be provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A microelement piezoelectric feedback type picking and releasing device comprising a piezoelectric material and an interdigital transducer electrode plated on said piezoelectric material, wherein said interdigital transducer electrode serves as a voltage signal feedback sensor, forming a clamping force control unit.

2. The microelement piezoelectric feedback type picking and releasing device as claimed in claim 1, wherein said interdigital transducer electrode forms a releasing unit by means of surface acoustic wave/ultrasonic wave.

3. A microelement piezoelectric feedback type picking and releasing device comprising a piezoelectric material, and a progressive electrode plated on said piezoelectric material, said progressive electrode having a plurality of electrode elements of different sizes arranged in an order of decreasing size order in one direction.

4. A microelement piezoelectric feedback type picking and releasing device comprising a piezoelectric material, an interdigital transducer electrode plated on said piezoelectric material, and a progressive electrode plated on said piezoelectric material, said progressive electrode comprising a plurality of electrode elements of different sizes arranged in proper order in one direction, wherein interdigital transducer electrode serves as a voltage signal feedback sensor, forming a clamping force control unit.

5. The microelement piezoelectric feedback type picking and releasing device as claimed in claim 4, wherein said interdigital transducer electrode forms a releasing unit by means of surface acoustic wave/ultrasonic wave.

* * * * *